(12) United States Patent
Rodin et al.

(10) Patent No.: US 7,493,577 B2
(45) Date of Patent: Feb. 17, 2009

(54) AUTOMATIC RECOGNITION OF GEOMETRIC POINTS IN A TARGET IC DESIGN FOR OPC MASK QUALITY CALCULATION

(75) Inventors: Sergei Rodin, Moscow (RU); Stanislav V. Aleshin, Moscow (RU); Ilya Golubtsov, Moscow (RU)

(73) Assignee: LSI Corporation, Milpitas, CA (US)

( * ) Notice: Subject to any disclaimer, the term of this patent is extended or adjusted under 35 U.S.C. 154(b) by 798 days.

(21) Appl. No.: 11/002,576

(22) Filed: Dec. 1, 2004

(65) Prior Publication Data

US 2006/0117292 A1 Jun. 1, 2006

(51) Int. Cl.
*G06F 17/50* (2006.01)
(52) U.S. Cl. .................... 716/5; 716/4; 716/19; 716/21
(58) Field of Classification Search .................... 716/4, 716/5, 19–21
See application file for complete search history.

(56) References Cited

U.S. PATENT DOCUMENTS

| | | | |
|---|---|---|---|
| 6,973,633 B2* | 12/2005 | Lippincott et al. | 716/11 |
| 2005/0164099 A1* | 7/2005 | Gelsomini | 430/5 |

* cited by examiner

*Primary Examiner*—Vuthe Siek
(74) *Attorney, Agent, or Firm*—Strategic Patent Group, P.C.

(57) ABSTRACT

A method and system is provided for automatically recognizing geometric points of features in a target design for OPC mask quality calculation. For each feature in the target design, x, y points comprising the feature are traversed and each neighboring pair of points is connected to define respective segments, wherein a set of contiguous segments form a step if the x values of the segments/points all increase or decrease and the same is true for the y values. Physical characteristics of the segments of the respective features are determined by comparing lengths of the segments to one another and to threshold values. Locations of quality measuring points are then determined along particular ones of the segments based on the physical characteristics.

23 Claims, 7 Drawing Sheets

AUTOMATIC RECOGNITION OF GEOMETRIC POINTS IN A TARGET IC DESIGN FOR OPC MASK QUALITY CALCULATION

FIELD OF THE INVENTION

The present invention relates to optical proximity correction in integrated circuit designs, and more particularly to automatically recognize geometric points in a target design for OPC mask quality calculation.

BACKGROUND OF THE INVENTION

The minimum feature sizes of integrated circuits (ICs) have been shrinking for years. Commensurate with this size reduction, various process limitations have made IC fabrication more difficult particularly in the area of. One area of fabrication technology in which such limitations have appeared is photolithography.

An integral component of photolithographic apparatus is a "reticle" which includes a pattern corresponding to features at one layer in an IC design. As light passes through the reticle, it is refracted and scattered by the chromium edges. This causes the projected image to exhibit some rounding and other optical distortion. While such effects pose relatively little difficulty in layouts with large feature sizes (e.g., layouts with critical dimensions above about 1 micron), they cannot be ignored in layouts having features smaller than about 1 micron. The problems become especially pronounced in IC designs having feature sizes near the wavelength of light used in the photolithographic process.

To remedy this problem, a reticle correction technique known as optical proximity correction (OPC) has been developed. Optical proximity correction involves adding dark regions to and/or subtracting dark regions from a reticle design at locations chosen to overcome the distorting effects of diffraction and scattering. Typically, OPC is performed on a digital representation of a desired IC pattern. First, the digital pattern is evaluated with software to identify regions where optical distortion will result, and a digital representation of a reticle or photomask design is modified to create an optically corrected or OPC mask. The modification is performed by a computer having appropriate software for performing OPC. A mask simulator is then used to emulate the wafer printing characteristics of the OPC mask during optical lithography, resulting in an OPC aerial image.

To calculate the quality of the OPC mask, process engineers manually compare the target design to the aerial image to determine if features patterned within the aerial image are within some threshold of the corresponding features in the target design. This is done by measuring distances between the points in the target design and the corresponding points aerial image. Evaluation of each point requires analysis of surrounding features in two-dimensions to determine whether problematic diffraction effects are likely. Places in the mask that result in distances greater than the specified threshold are corrected (e.g., serif or segment removal, for example), and the process is repeated until acceptable results are obtained. The problem is that process engineers must first manually identify the geometric points in the target design to compare to the aerial image, and then visually determine if the points in the target design are separated by less than the threshold to the corresponding points in the aerial image.

Accordingly, what is needed is a method and system that automatically recognizing geometric points in the target design for which to compare with the aerial image for OPC mask quality calculation. The present invention addresses such a need.

BRIEF SUMMARY OF THE INVENTION

The present invention provides a method and system for automatically recognizing geometric points of features in a target design for OPC mask quality calculation. For each feature in the target design, x, y points comprising the feature are traversed and each neighboring pair of points is connected to define respective segments, wherein a set of contiguous segments form a step if the x values of the segments/points all increase or decrease and the same is true for the y values. Physical characteristics of the segments of the respective features are determined by comparing lengths of the segments to one another and to threshold values. Locations of quality measuring points are then determined along particular ones of the segments based on the physical characteristics.

DETAILED DESCRIPTION OF THE INVENTION

The present invention relates to optical proximity correction in integrated circuit designs, and more particularly to automatic recognition of geometric points in a target design for OPC mask quality calculations. The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown, but is to be accorded the widest scope consistent with the principles and features described herein.

Figure 1:
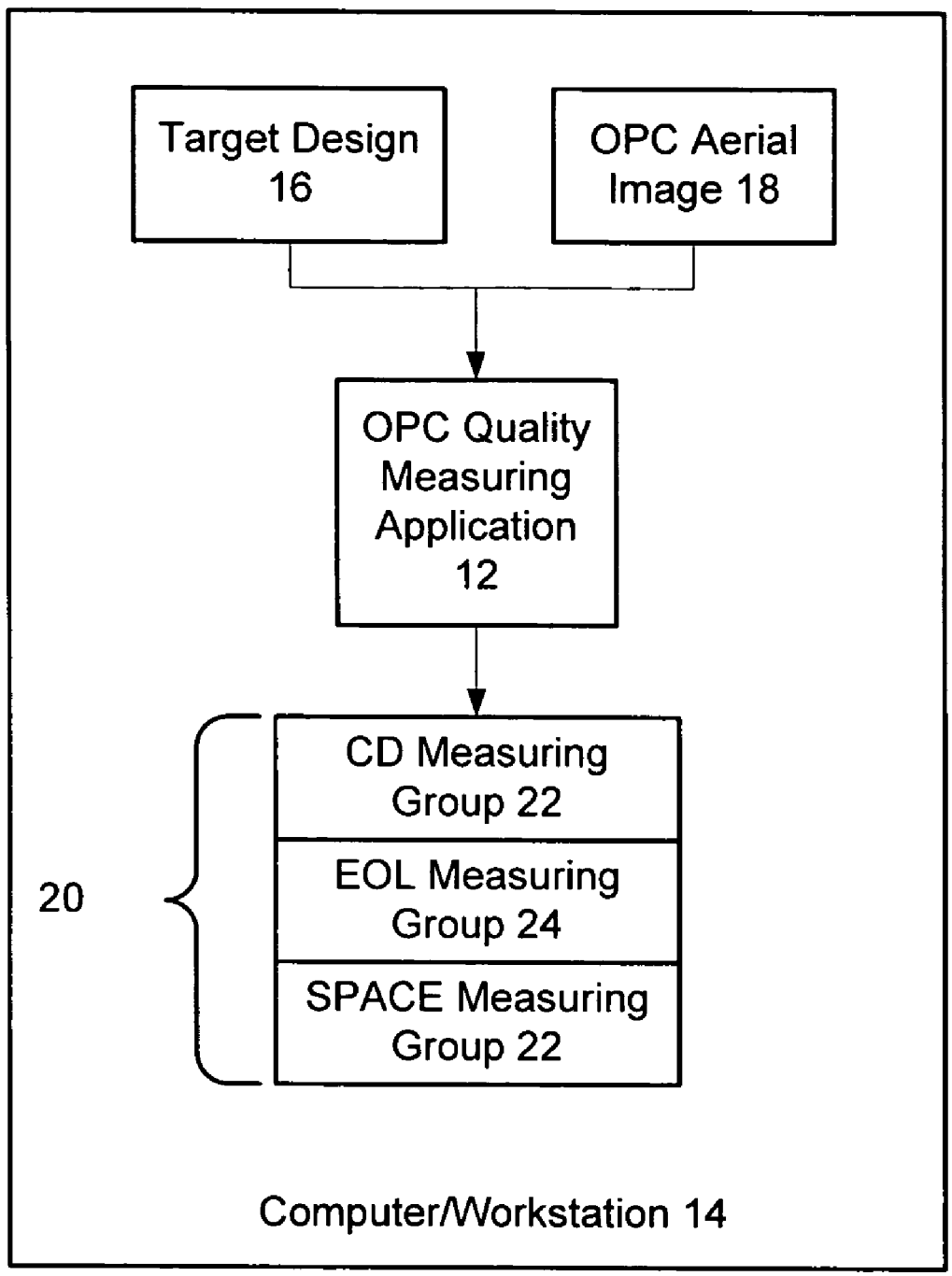
FIG. 1 is a block diagram illustrating an OPC quality measuring system for automatically recognizing geometric measuring points for OPC mask quality calculations according to a preferred embodiment of the present invention.

FIG. 1 is a block diagram illustrating an OPC quality measuring system for automatically recognizing geometric measuring points for OPC mask quality calculations according to a preferred embodiment of the present invention. The system 10 includes a quality checking software application 12 executing on processor in a computer/workstation 14 or a server that is accessed over a network (not shown). The workstation 14 preferably includes a microprocessor that is coupled to a non-volatile storage device, e.g., a conventional hard disk storage device. The microprocessor and the hard disk storage device are coupled to a volatile storage device, e.g. a random access memory (RAM). A monitor may be coupled to the workstation for displaying a user interface.

Inputs to the quality checking application 12 are a target design 16 and optionally an OPC aerial image 18. Preferably, the target design 16 is described in an electronic format, e.g., GDS II which may represent individual features in the design 16 as a set of x, y points. The OPC aerial image 18 emulates the wafer printing characteristics of an OPC mask during optical lithography.

According to the preferred embodiment, the quality checking application 12 analyzes the target design 16 and automatically recognizes geometric points in features in the target design to use for OPC mask calculations. These points are output in the form of OPC quality measuring groups 20, which include a Critical Dimension (CD) group 22 having CD points, an End-of-line (EOL) group 24 having EOL points, and a Space group 26 having points to measure spaces between features. Every CD and Space point in the CD group 22 and Space Group 26 are described with two x, y points. Every EOL point in the EOL group 24 is described with one x, y point.

Figure 2:
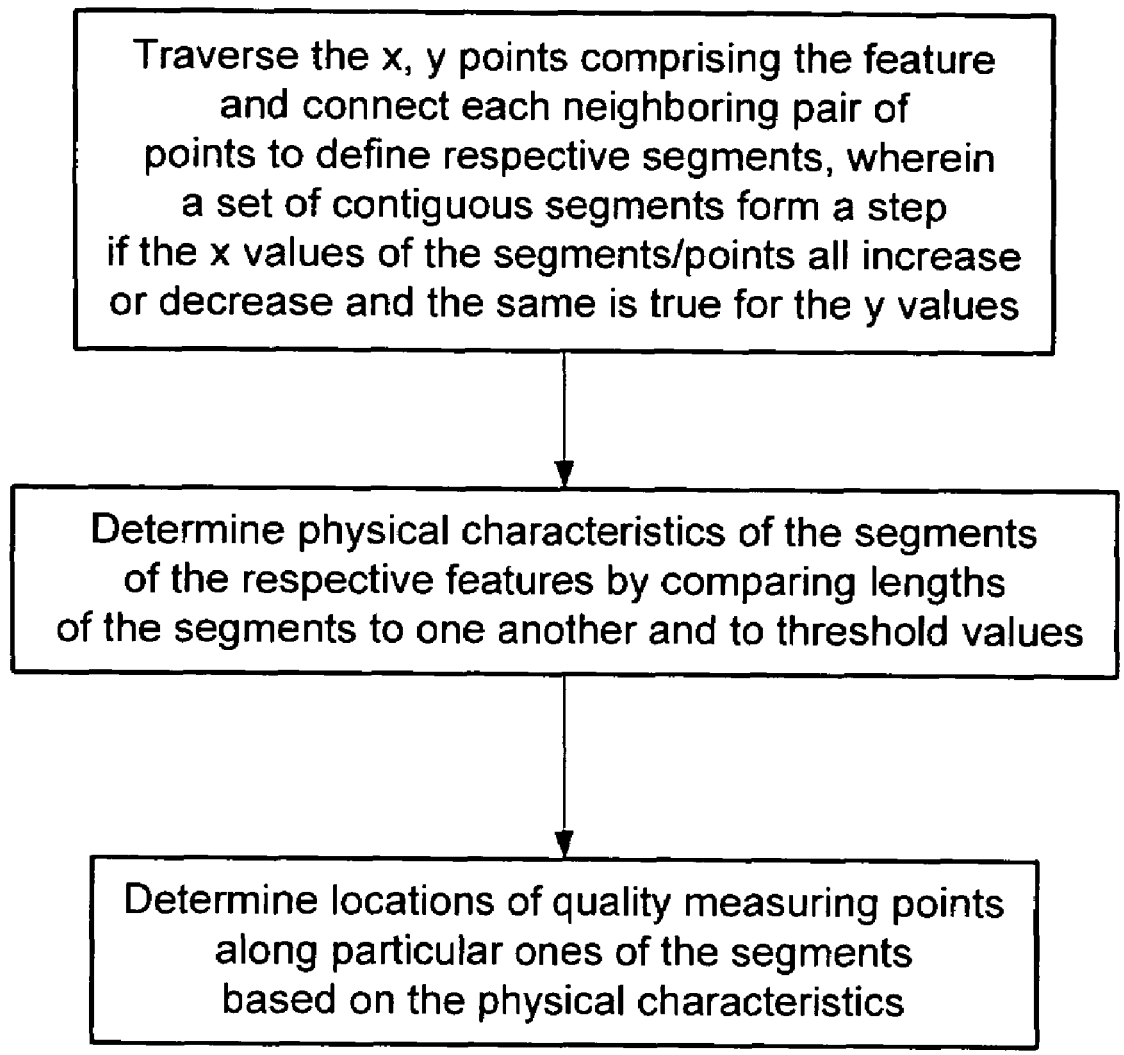
FIG. 2 is a flow diagram illustrating the process for automatically recognizing geometric points of features in a target design for OPC mask quality calculation in accordance with a preferred embodiment.

FIG. 2 is a flow diagram illustrating the process for automatically recognizing geometric points of features in a target design for OPC mask quality calculation in accordance with a preferred embodiment. The quality measuring application 12 performs the process on each feature in the target design and begins by traversing the x, y points comprising the feature in step 50 and connecting each neighboring pair of points to define respective segments, wherein a set of contiguous segments form a step if the x values of the segments/points all increase or decrease and the same is true for the y values. The quality measuring application 12 traverses the x, y points with the assumption that every feature in the design 16 is oriented clockwise. In a preferred embodiment, steps are defined as:

using segments $S_1=(a_1, a_2)$, $S_2=(a_2, a_3)$, ..., $S_n=(a_n, a_{n+1})$, where each point $a_i$ has the coordinates $x_i, y_j$, $1 \leq i \leq n$, a step is created from the segments if:

$$\sum_1 |x_{i+1} - x_1| = \left|\sum_1 x_{i+1} - x_1\right| \text{ and } \sum_1 |y_{i+1} - y_1| = \left|\sum_1 y_{i+1} - y_1\right|$$

In step 52 physical characteristics of the segments of the respective features are determined by comparing lengths of the segments to one another and to threshold values. In a preferred embodiment, the physical characteristics are determined in part by comparing the length of the segments with four threshold values, JOGV, SHORTV, LONGV, and DIFFV. JOGV is a threshold value used for identifying jog segments of a feature. SHORTV is a threshold value used for identifying short segments of a feature. LONGV is a threshold value used for identifying long segments of a feature. And DIFFV is a threshold value used for measuring the length difference between segments.

Based on these comparisons, the physical characteristics of each segment are used to identify the segment type and to label the segment with corresponding labels: JOG, SHORT, LONG, EOLS, and BackEOL. The threshold values are configurable by an operator of the quality measuring application 12. The segment types are also used to examine the Spaces between features, as described below.

In step 54 locations of quality measuring points along particular ones of the segments is determined based on the physical characteristics, as explained below.

Figure 3:
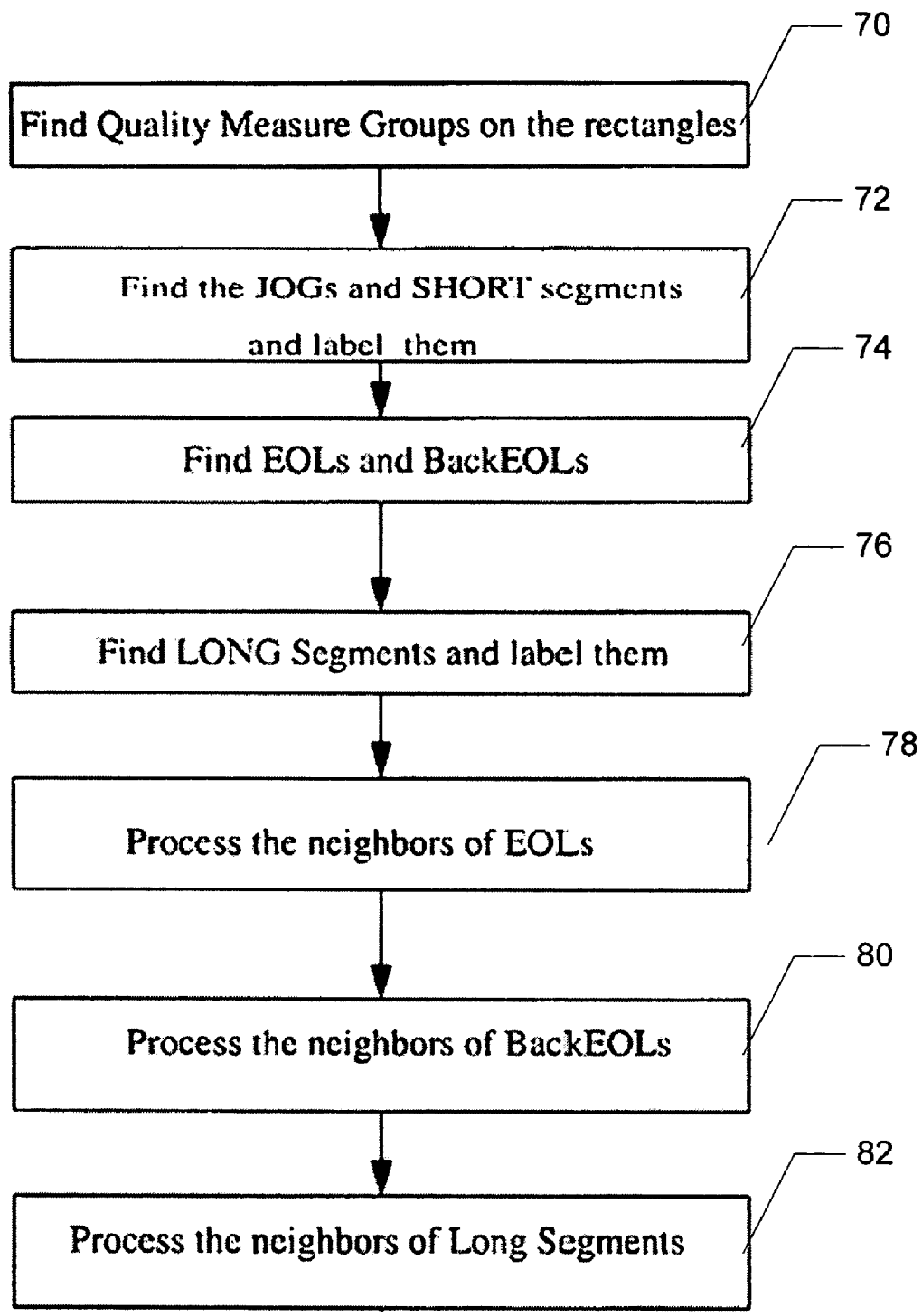
FIG. 3 is a flow diagram illustrating the process for determining the physical characteristics of the segments (steps 52 and 54) in further detail.

FIG. 3 is a flow diagram illustrating the process for determining the physical characteristics of the segments (steps 52 and 54) in further detail. After defining the segments, the quality measuring application 12 in step 70 examines all features that are rectangles (i.e., having four segments) and finds the points in the rectangle features to add to the quality measuring groups 20. In a preferred embodiment, step 70 may be implemented by the following pseudo code:

1. Find all rectangles having four sides (segments).
   1.1 The rectangles with sides a, b are contact features if.
      a) a and b less than SHORTV and greater than JOBGv; and
      b) the difference between a and b is less than DiffV.
   In this case middle points of opposite sides placed in the CDs quality measure groups, and the sides are labeled as SHORT.
   1.2 The rectangles with sides a and b are lines (we assume than a is less than b)
      a) if a is greater than JOGV and less than SHROTV
      b) if b is greater than LONGV
   In this case middle points of sides with length is equal a are placed in the EOLPs quality measure group and middles of sides with length is equal b are placed in the CD-measure group. Greater length sides are labeled as LONG and shorter sides as SHORT.

In step 72, the quality measuring application 12 finds and labels the JOGS and SHORT segments. In a preferred embodiment, step 72 may be implemented by the following pseudo code:
   2.1 If unlabeled segment is shorter then JOG value, label it as JOG.
   2.2 If unlabeled segment is shorter then SHORT value, label it as SHORT.

In step 74, the quality measuring application 12 finds and labels the EOLS and BackEOL segments. In a preferred embodiment, step 74 may be implemented by the following pseudo code:
   3. Among all segments labeled as SHORT, find EOLSs (using the definition given below) and for each, label as such and place middle point of the EOLS in the EOLP-quality measure group.
   4. Among all segments labeled as SHORT, find BackEOLs (using the definition given below) and for each, label as such and place the middle point of the segment in the EOLP-quality measure group.

In step 76, the quality measuring application 12 finds and labels the LONG segments. In a preferred embodiment, step 76 may be implemented by the following pseudo code:
   5. If any unlabeled segment is grater than the LONGV value, label it as LONG.

The remaining steps are for finding Space points for the Space quality group 26. In step 78, the quality measuring application 12 processes the segments neighboring the EOL segments. In a preferred embodiment, step 78 may be implemented by the following pseudo code:

Let R equal SHORTV.

6. For each segment S labeled as EOLS, find its R-neighbors (defined below). Among neighbors segments find all segment $S_{SPACE}$ which are:
   a) parallel and has the opposite direction to S
   b) The length of the projection of the segment $S_{SPACE}$ on the S is greater than half length of the segment $S_{SPACE}$ and greater than half length of S, For every found segment $S_{SPACE}$ do:

If segment $S_{SPACE}$ is labeled as EOLS, then place the middle points of the segments S and $S_{SPACE}$ in the SPACE quality measure group.

Figure 4:
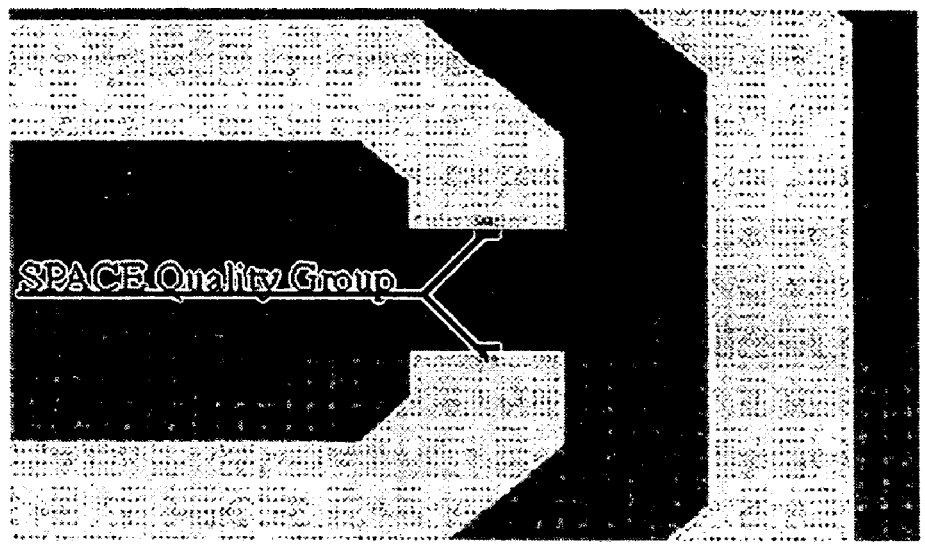
FIG. 4 is a diagram illustrating two example EOL points on neighboring EOL segments used to generate the SPACE quality group.

FIG. 4 is a diagram illustrating two example EOL points on neighboring EOL segments used to generate the SPACE quality group 26. Step 78 continues with:

If segment $S_{SPACE}$ is labeled as LONG, project the middle points of S on the $S_{SPACE}$. And those points are the SPACE quality measure group. Then for $S_{SPACE}$ find its neighbor segments.

And among them find all segments $S_{CD}$ that are:
   a) parallel and has the opposite direction to $S_{SPACE}$
   b) The length of the projection of the segment $S_{CD}$ on the $S_{SPACE}$ is greater then half length of the segment $S_3$ and greater than half length of the $S_{SPACE}$.
   c) label the segment $S_{CD}$ as LONG.

For each found segment $S_{CD}$ find the middle point of its projection on the segment $S_{SPACE}$, and the middle point of the projection $S_{SPACE}$ on the $S_{CD}$.

Place those two points in the CD-quality measure group.

Figure 5:
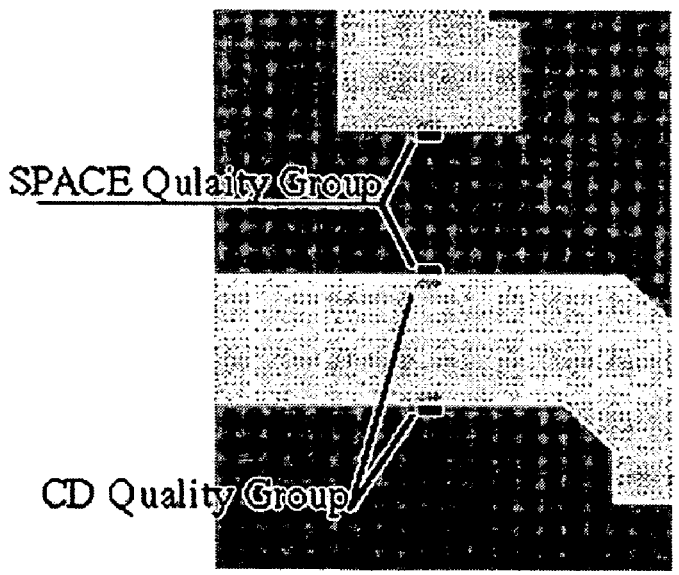
FIG. 5 is a diagram illustrating a LONG segment within an R-neighborhood of an EOL segment and the points thereon that belong to the SPACE quality group.

FIG. 5 is a diagram illustrating a LONG segment within an R-neighborhood of an EOL segment and the points thereon that belong to the SPACE quality group 26. Also shown are points on the segment belonging to the CD-quality group 22.

Referring again to FIG. 3, in step 80, the quality measuring application 12 processes the segments neighboring the BackEOL segments. In a preferred embodiment, step 80 may be implemented by the following pseudo code:

7. For each segment S labeled as BackEOL, find its R-neighbor. Among R-neighbors find all segments $S_{CD}$ which are:
   a) parallel and has the opposite direction to S
   b) The length of the projection of the segment $S_{CD}$ on the S and greater than half length of the $S_{CD}$ and greater than half length of the segment S.

For each found segment, take the middle point of S and its projection on the segment $S_{CD}$. Place these two points in the CD quality measure group.

Figure 6:
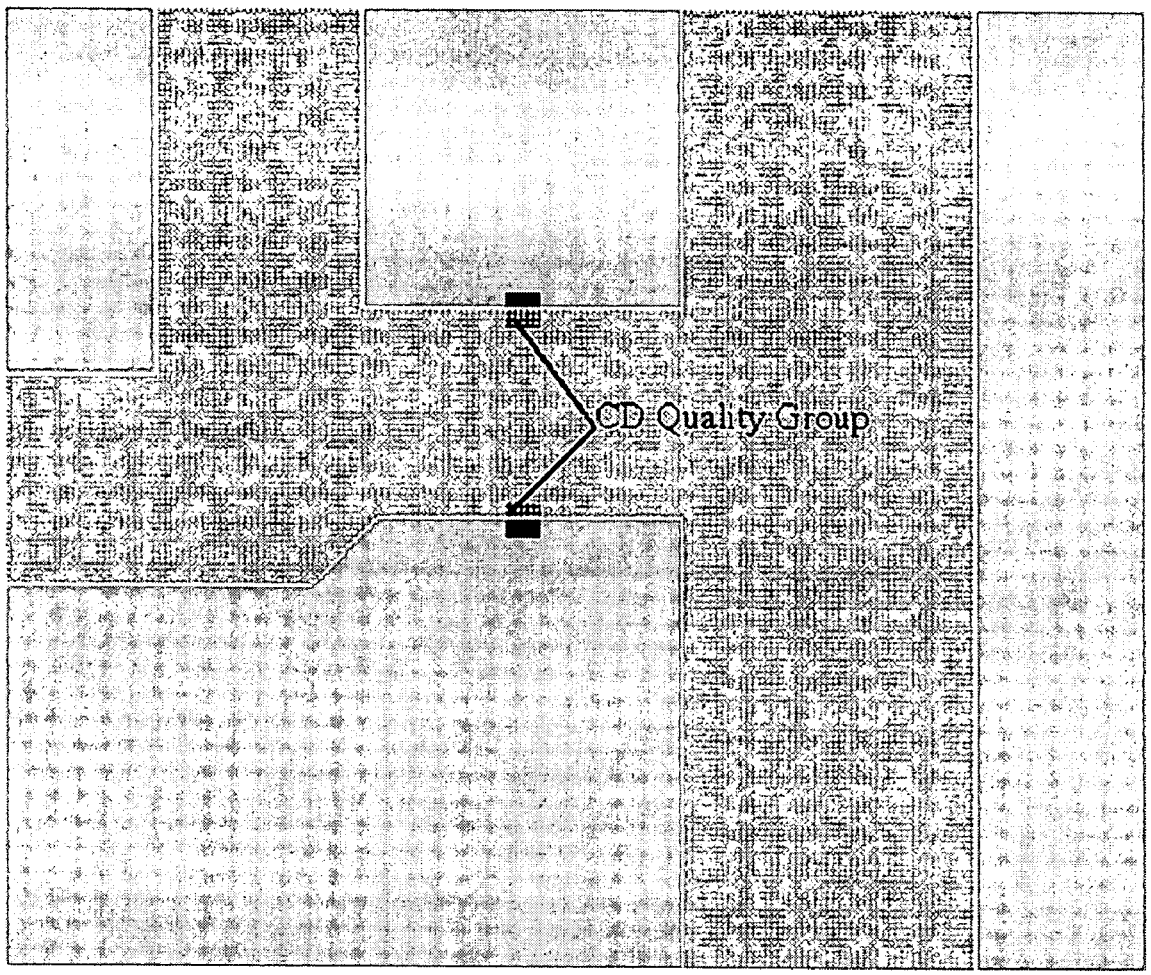
FIG. 6 is a diagram illustrating the points placed in the CD quality group 22 of CD segments that are R-neighbors of a BackEOL segment.

FIG. 6 is a diagram illustrating the points placed in the CD quality group 22 of CD segments that are R-neighbors of a BackEOL segment.

Referring again to FIG. 3, in step 82, the quality measuring application 12 processes the segments neighboring the LONG segments. In a preferred embodiment, steps 82 may be implemented by the following pseudo code:

8. For each segment S labeled as LONG, find its neighbor segments.

And among them find segment $S_{CD}$ which are:
   a) parallel and has the opposite direction to S
   b) The length of the projection of the segment $S_{CD}$ on the S is greater than half length of the segment $S_{CD}$ and greater than half length of the S
   c) the segment $S_{CD}$ is labeled as LONG.

For each found segment, take the middle point of its projection on the segment S, and the middle point of the projection $S_{CD}$ on the S. Place these two points in the CD quality measure group.

Figure 7:
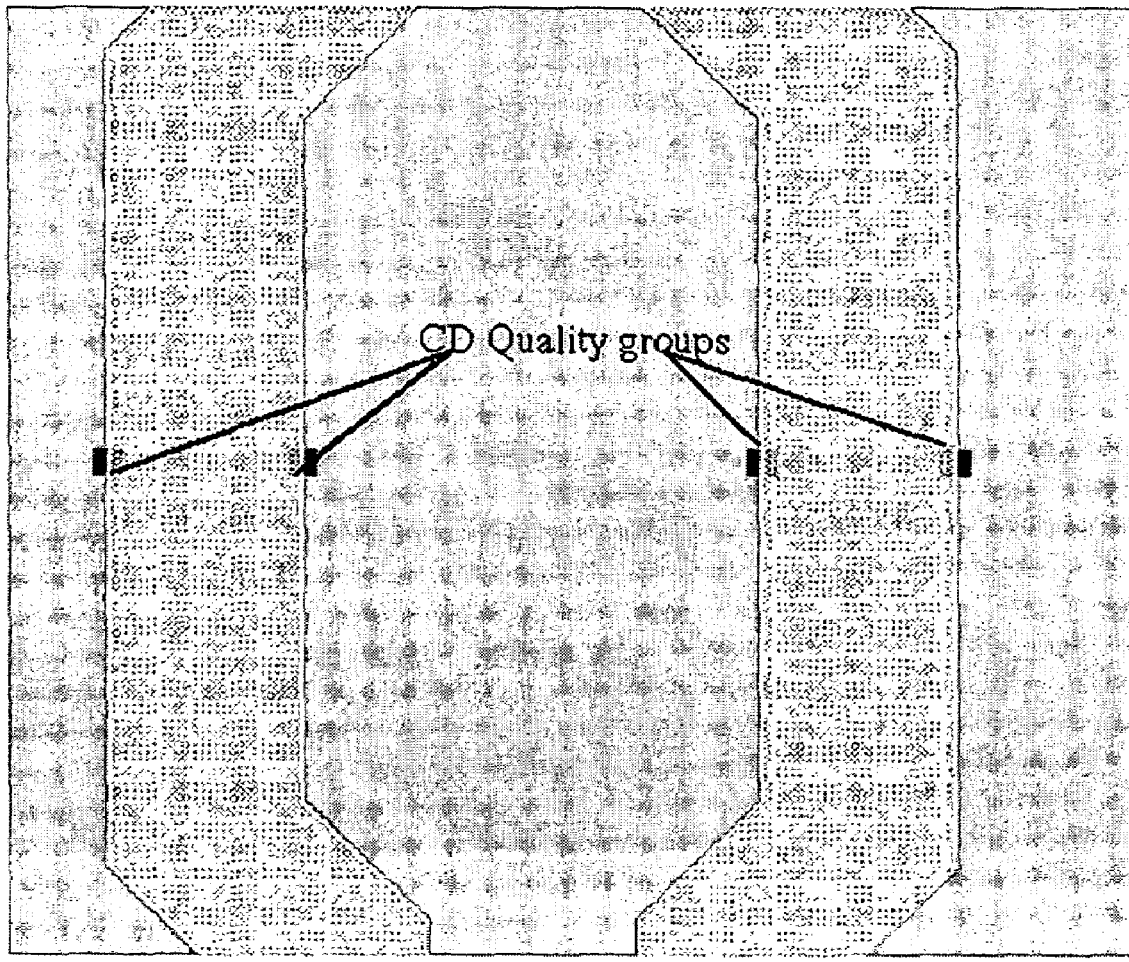
FIG. 7 is a diagram illustrating the points placed in the CD quality group of CD segments that are R-neighbors of a LONG segment.

FIG. 7 is a diagram illustrating the points placed in the CD quality group 22 of CD segments that are R-neighbors of a LONG segment.

The algorithm is based on the following definitions for EOL, BackEOL, and R-neighbor, and Projection:

EOL Definition:
A segment S is the EOL if:
   a) the length of segment is greater than JOGV, and less than SHORTV.
   b) the first predecessor segment has a length greater than JOGV and the first successor segments has a length greater than JOGV and are parallel and lie in a half-plane to the right of the segment (vector) S.
   c) The sum of lengths of the predecessors that form the step is greater than LONGV.
   d) The sum of lengths of the successors that form the step is greater than LONGV.

Figure 8:
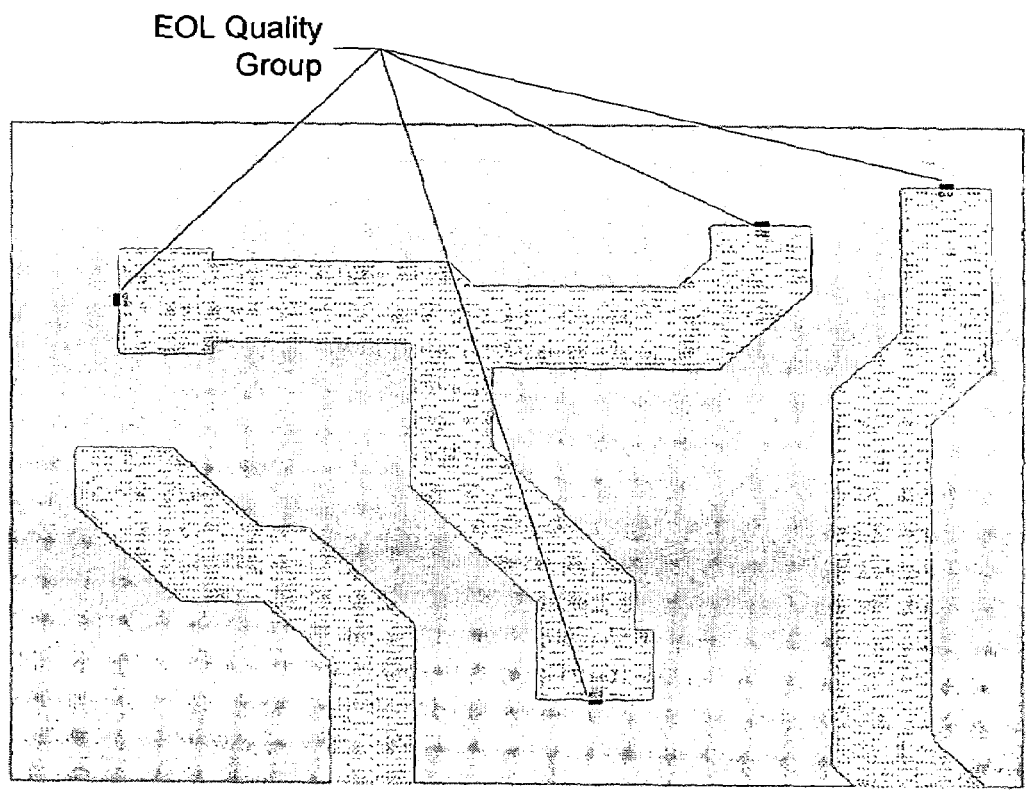
FIG. 8 is a diagram illustrating EOL points on features.

FIG. 8 is a diagram illustrating EOL points on features.

Figure 9:
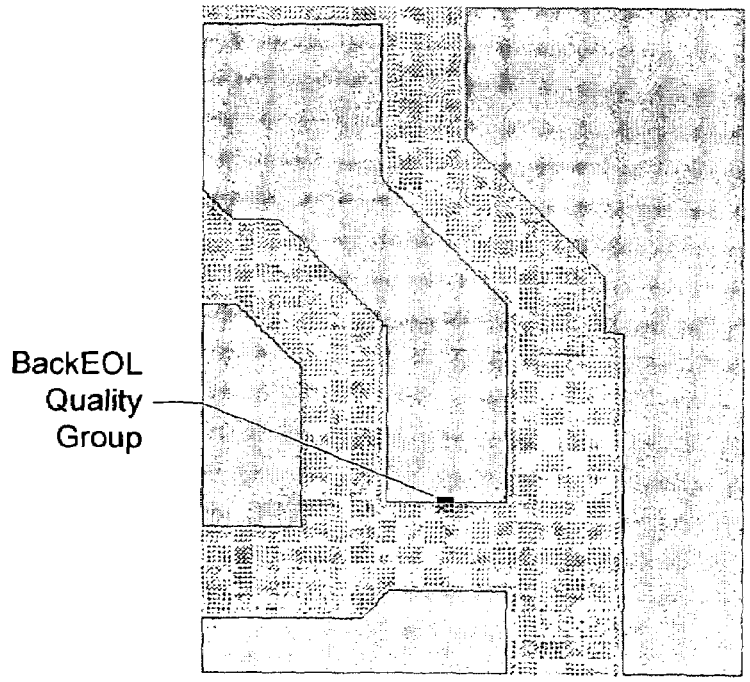
FIG. 9 is a diagram illustrating a BackEOL point on a feature

BackEOL Definition:
A segment S is the BackEOL if:
   a) the length of segment is greater than JOGV, and less than SHORTV.
   b) the first predecessor segment has a length greater than JOGV and the first successor segments has a length is greater than JOGV and are parallel and lie in half-plane to the left of the segment (vector) S.
   c) The sum of lengths of the predecessors that form the step is greater than LONGV
   d) The sum of lengths of the successors that form the step is greater than LONGV FIG. 9 is a diagram illustrating a BackEOL point on a feature.

R-Neighbor Definition:
R-Neighbors of segment S on the radius R are all segments from the design such that the distances between them and S are less than value R.

Projection Definition:
Definition: Projection of the segment $S_1$ on the segment $S_2$ will be the segment where the starting point is: the projection of the starting point of the $S_1$ on the line which contains $S_2$ if the projection lies within $S_2$ or
the closest end of $S_2$ if the projection lies out of segment $S_2$ the projection of the end point of the $S_1$ on the line which contains $S_2$ if the projection lies within $S_2$ or
the closest end of $S_2$ if the projection lies out of segment $S_2$ The quality measuring groups 20 output by the quality measuring application 12 contain the geometric points of the design 16 that are the most critical for quality.

A method and system for automatically recognizing geometric points in a target design for OPC mask quality calculation has been disclosed. The present invention has been described in accordance with the embodiments shown, and one of ordinary skill in the art will readily recognize that there could be variations to the embodiments, and any variations would be within the spirit and scope of the present invention. Accordingly, many modifications may be made by one of ordinary skill in the art without departing from the spirit and scope of the appended claims.

We claim:

1. A method for automatically recognizing geometric points of features in a target design for OPC mask quality calculation, comprising;

for each feature in the target design, traversing x, y points comprising the feature and connecting each neighboring pair of points to define respective segments, wherein a set of contiguous segments form a step if the x values of the segments/points all increase or decrease and the same is true for the y values;

determining physical characteristics of the segments of the respective features by comparing lengths of the segments to one another and to threshold values, wherein the threshold values comprise a first threshold value for identifying jog segments of a feature, a second threshold value for identifying short segments of a feature, a third threshold value for identifying long segments of a feature, and a fourth threshold value for measuring the length difference between segments;

determining locations of quality measuring points along particular ones of the segments based on the physical characteristics; and outputting the quality measuring points into quality measuring groups, including a Critical Dimension (CD) group having CD points, an End-of-line (EOL) group having EOL points, and a Space group having points to measure spaces between features.

2. The method of claim 1 further including: traversing the x, y points with the assumption that every feature in the design is oriented clockwise, and defining a step as:

using segments $S_1=(a_1, a_2)$, $S_2=(a_2, a_3)$, ..., $S_n=(a_n, a_{n+1})$, where each point $a_i$ has the coordinates $x_i, y_i$, $1 \leq i \leq n$, a step is formed if:

$$\sum_1 |x_{i+1} - x_1| = \left|\sum_1 x_{i+1} - x_1\right| \text{ and } \sum_1 |y_{i+1} - y_1| = \left|\sum_1 y_{i+1} - y_1\right|.$$

3. A method for automatically recognizing geometric points of features in a target design for OPC mask quality calculation, the method comprising:

for each feature in the target design, traversing x, y points comprising the feature and connecting each neighboring pair of points to define respective segments, wherein a set of contiguous segments form a step if the x values of the segments/points all increase or decrease and the same is true for the y values;

wherein the x, y points are traversed with the assumption that every feature in the design is oriented clockwise, and wherein the step is defined as:

using segments $S_1=(a_1, a_2)$, $S_2=(a_2, a_3)$, ..., $S_n=(a_n, a_{n+1})$, where each point $a_i$ has the coordinates $x_i, y_i$, $1 \leq i \leq n$, the step is formed if:

$$\sum_1 |x_{i+1} - x_1| = \left|\sum_1 x_{i+1} - x_1\right| \text{ and } \sum_1 |y_{i+1} - y_1| = \left|\sum_1 y_{i+1} - y_1\right|;$$

determining physical characteristics of the segments of the respective features by comparing segment lengths to one another and to threshold values, including a first threshold value for identifying jog segments of a feature, a second threshold value for identifying short segments of a feature, a third threshold value for identifying long segments of a feature, and a fourth threshold value for measuring the length difference between segments;

determining locations of quality measuring points along particular ones of the segments based on the physical characteristics; and outputting the quality measuring points into quality measuring groups, including a Critical Dimension (CD) group having CD points, an End-of-line (EOL) group having EOL points, and a Space group having points to measure spaces between features.

4. The method of claim 3 further including: allowing the threshold values to configurable by an operator.

5. The method of claim 4 further including: using the physical characteristics of each segment to identify a segment type and to label the segment with the corresponding labels.

6. The method of claim 5 wherein the labels identify JOG, SHORT, LONG, EOLS, and BackEOL segments.

7. The method of claim 6 wherein determining physical characteristics of the segments further includes:

examining all features that are rectangles and finding the points in the rectangle features to add to the quality measuring groups;

finding and labeling the JOGS and SHORT segments;

finding and labeling the EOLS and BackEOL segments;

finding and labeling the LONG segments; and finding Space points for the Space quality group by:
processing segments neighboring the EOL segments,
processing segments neighboring the BackEOL segments, and
processing segments neighboring the LONG segments.

8. The method of claim 7 further including the step of: defining an EOL segment as:

a segment S is the EOL if:
a) the length of segment is greater than JOGV, and less than SHORTV,
b) the first predecessor segment has a length greater than JOGV and the first successor segments has a length greater than JOGV and are parallel and lie in a half-plane to the right of the segment (vector) S,
c) the sum of lengths of the predecessors that form the step is greater than LONGV,
d) the sum of lengths of the successors that form the step is greater than LONGV.

9. The method of claim 7 further including the step of: defining a BackEOL segment as:

a segment S is the BackEOL if:
a) the length of segment is greater than JOGV, and less than SHORTV
b) the first predecessor segment has a length greater than JOGV and the first successor segments has a length is greater than JOGV and are parallel and lie in half-plane to the left of the segment (vector) S,
c) the sum of lengths of the predecessors that form the step is greater than LONGV,
d) the sum of lengths of the successors that form the step is greater than LONGV.

10. The method of claim 7 further including the step of: defining an R-Neighbor as:

an R-Neighbor of segment S on a radius R is segment from the design, such that the distances between it and S is less than value R.

11. The method of claim 7 further including the step of: defining a Projection as:

a projection of segment $S_1$ on segment $S_2$ will be a segment where a starting point of the segment is: a projection of the starting point of the $S_1$ on a line which contains $S_2$ if the projection lies within $S_2$ or
a closest end of $S_2$ if the projection lies out of segment $S_2$
a projection of a end point of $S_1$ on a line which contains $S_2$ if the projection lies within $S_2$ or
a closest end of $S_2$ if the projection lies out of segment $S_2$.

12. An OPC quality measuring system, comprising:
a target design in an electronic format that represents individual features as a set of x, y points; and
a quality checking software application executing on processor for analyzing the target design by,
for each feature in the target design, traversing x, y points comprising the feature and connecting each neighboring pair of points to define respective segments, wherein a set of contiguous segments form a step if the x values of the segments/points all increase or decrease and the same is true for the y values;
determining physical characteristics of the segments of the respective features by comparing lengths of the segments to one another and to threshold values, wherein the threshold values comprise a first threshold value for identifying jog segments of a feature, a second threshold value for identifying short segments of a feature, a third threshold value for identifying long segments of a feature, and a fourth threshold value for measuring the length difference between segments; and
determining locations of quality measuring points along particular ones of the segments based on the physical characteristics; and
outputting the quality measuring points into quality measuring groups, including a Critical Dimension (CD) group having CD points, an End-of-line (EOL) group having EOL points, and a Space group having points to measure spaces between features.

13. The system of claim 12 wherein: traversing the x, y points with the assumption that every feature in the design is oriented clockwise, and defining a step as:
using segments $S_1=(a_1, a_2), S_2=(a_2, a_3), \ldots, S_n=(a_n, a_{n+1})$, where each point $a_i$ has the coordinates $x_i, y_i, 1 \leq i \leq n$, a step is formed if:

$$\sum_1 |x_{i+1} - x_1| = \left|\sum_1 x_{i+1} - x_1\right| \text{ and } \sum_1 |y_{i+1} - y_1| = \left|\sum_1 y_{i+1} - y_1\right|.$$

14. An OPC quality measuring system comprising:
a target design in an electronic format that represents individual features as a set of x, y points; and
a quality checking software application executing on processor for analyzing the target design by,
for each feature in the target design, traversing x, y points comprising the feature and connecting each neighboring pair of points to define respective segments, wherein a set of contiguous segments form a step if the x values of the segments/points all increase or decrease and the same is true for the y values;
wherein the x, y points are traversed with the assumption that every feature in the design is oriented clockwise, and wherein the step is defined as:
using segments $S_1=(a_1, a_2), S_2=(a_2, a_3), \ldots, S_n=(a_n, a_{n+1})$, where each point $a_i$ has the coordinates $x_i, y_i, 1 \leq i \leq n$, the step is formed if:

$$\sum_1 |x_{i+1} - x_1| = \left|\sum_1 x_{i+1} - x_1\right| \text{ and } \sum_1 |y_{i+1} - y_1| = \left|\sum_1 y_{i+1} - y_1\right|;$$

determining physical characteristics of the segments of the respective features by comparing segment lengths to one another and to threshold values, including a first threshold value for identifying jog segments of a feature, a second threshold value for identifying short segments of a feature, a third threshold value for identifying long segments of a feature, and a fourth threshold value for measuring the length difference between segments;
determining locations of quality measuring points along particular ones of the segments based on the physical characteristics; and
outputting the quality measuring points into quality measuring groups, including a Critical Dimension (CD) group having CD points, an End-of-line (EOL) group having EOL points, and a Space group having points to measure spaces between features.

15. The system of claim 14 wherein: allowing the threshold values to configurable by an operator.

16. The system of claim 15 wherein: using the physical characteristics of each segment to identify a segment type and to label the segment with the corresponding labels.

17. The system of claim 16 wherein the labels identify JOG, SHORT, LONG, EOLS, and BackEOL segments.

18. The system of claim 17 wherein determining physical characteristics of the segments further includes:
examining all features that are rectangles and finding the points in the rectangle features to add to the quality measuring groups;
finding and labeling the JOGS and SHORT segments;
finding and labeling the EOLS and BackEOL segments;
finding and labeling the LONG segments; and
finding Space points for the Space quality group by:
processing segments neighboring the EOL segments,
processing segments neighboring the BackEOL segments, and
processing segments neighboring the LONG segments, 19. The system of claim 17 wherein the step of: defining an EOL segment as:
a segment S is the EOL if:
a) the length of segment is greater than JOGV, and less than SHORTV,
b) the first predecessor segment has a length greater than JOGV and the first successor segments has a length greater than JOGV and are parallel and lie in a half-plane to the right of the segment (vector) S,
c) the sum of lengths of the predecessors that form the step is greater than LONGV,
d) the sum of lengths of the successors that form the step is greater than LONGV.

20. The system of claim 17 wherein the step of: defining a BackEOL segment as:
a segment S is the BackEOL if:
a) the length of segment is greater than JOGV, and less than SHORTV,
b) the first predecessor segment has a length greater than JOGV and the first successor segments has a length is greater than JOGV and are parallel and lie in half-plane to the left of the segment (vector) S,
c) the sum of lengths of the predecessors that form the step is greater than LONGV,
d) the sum of lengths of the successors that form the step is greater than LONGV.

21. The system of claim 17 wherein the step of: defining an R-Neighbor as:
an R-Neighbor of segment S on a radius R is segment from the design such that the distances between it and S is less than value R.

22. The system of claim 17 wherein the step of: defining a Projection as:
a projection of segment $S_1$ on segment $S_2$ will be a segment where a starting point of the segment is: a projection of the starting point of the $S_1$ on a line which contains $S_2$ if the projection lies within $S_2$ or a closest end of $S_2$ if the projection lies out of segment $S_2$ a projection of a end point of $S_1$ on a line which contains $S_2$ if the projection lies within $S_2$ or a closest end of $S_2$ if the projection lies out of segment $S_2$.

23. A computer-readable medium containing program instructions for automatically recognizing geometric points of features in a target design for OPC mask quality calculation, the program instructions for:

for each feature in the target design, traversing x, y points comprising the feature and connecting each neighboring pair of points to define respective segments, wherein a set of contiguous segments form a step if the x values of the segments/points all increase or decrease and the same is true for the y values;

wherein the x, y points are traversed with the assumption that every feature in the design is oriented clockwise, and wherein the step is defined as:

using segments $S_1=(a_1, a_2), S_2=(a_2, a_3), \ldots, S_n=(a_n, a_{n+1})$, where each point $a_i$ has the coordinates $x_i, y_i$, $1 \leq i \leq n$, the step is formed if:

$$\sum_1 |x_{i+1} - x_1| = \left|\sum_1 x_{i+1} - x_1\right| \text{ and } \sum_1 |y_{i+1} - y_1| = \left|\sum_1 y_{i+1} - y_1\right|;$$

determining physical characteristics of the segments of the respective features by comparing segment lengths to one another and to threshold values, including a first threshold value for identifying jog segments of a feature, a second threshold value for identifying short segments of a feature, a third threshold value for identifying long segments of a feature, and a fourth threshold value for measuring the length difference between segments;

determining locations of quality measuring points along particular ones of the segments based on the physical characteristics; and outputting the quality measuring points into quality measuring groups, including a Critical Dimension (CD) group having CD points, an End-of-line (EOL) group having EOL points, and a Space group having points to measure spaces between features.

* * * * *